(12) United States Patent  
Lin et al.

(10) Patent No.: US 11,665,946 B2  
(45) Date of Patent: May 30, 2023

(54) DISPLAY DEVICES, DISPLAY PANELS, AND METHODS FOR MANUFACTURING THE SAME

(71) Applicant: YUNGU (GU'AN) TECHNOLOGY CO., LTD., Langfang (CN)

(72) Inventors: Li Lin, Kunshan (CN); Shixing Cai, Kunshan (CN); Junhui Lou, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 293 days.

(21) Appl. No.: 17/232,157

(22) Filed: Apr. 16, 2021

(65) Prior Publication Data

US 2021/0233992 A1    Jul. 29, 2021

Related U.S. Application Data

(63) Continuation of application No. PCT/CN2019/106388, filed on Sep. 18, 2019.

(30) Foreign Application Priority Data

Mar. 28, 2019  (CN) .......................... 201910244450.8

(51) Int. Cl.  
    *H01L 51/50*        (2006.01)
(52) U.S. Cl.  
    CPC ......... *H10K 59/179* (2023.02); *H10K 50/813* (2023.02); *H10K 50/822* (2023.02);  
    (Continued)
(58) Field of Classification Search  
    CPC ... H10K 59/179; H10K 50/813; H10K 50/822  
    See application file for complete search history.

(56) References Cited

U.S. PATENT DOCUMENTS

| | | |
|---|---|---|
| 10,121,830 B1 | 11/2018 | Li |
| 2003/0162108 A1 | 8/2003 | Burberry et al. |
| | (Continued) | |

FOREIGN PATENT DOCUMENTS

| | | |
|---|---|---|
| CN | 1436026 A | 8/2003 |
| CN | 101060131 A | 10/2007 |
| | (Continued) | |

OTHER PUBLICATIONS

International Search Report of International Application No. PCT/CN2019/106388.  
Office Action of Chinese Patent Application No. 201910244450.8.

*Primary Examiner* — Anthony Ho  
(74) *Attorney, Agent, or Firm* — Kilpatrick Townsend & Stockton

(57) ABSTRACT

A display panel, a display device, and a method for manufacturing the display panel are provided. The display panel includes two electrode layers and a luminous functional layer stacked between the two electrode layers. Each electrode layer has a first surface and a second surface opposite to each other in a thickness direction thereof. The first surface of each electrode layer is attached to and in contact with the luminous functional layer. Each electrode layer includes at least one insulation section and at least one electrode section integrated as a single body. A material of the electrode section is a conductively modified form of a material of the insulation section. The electrode section is in contact with the luminous functional layer and is in a conductive state at least at the first surface. The electrode layer in the present disclosure has no conductive pattern and will not cause optical disturbance.

16 Claims, 6 Drawing Sheets

(52) U.S. Cl.
CPC ........... *H10K 71/00* (2023.02); *H10K 50/828* (2023.02); *H10K 2102/101* (2023.02); *H10K 2102/102* (2023.02); *H10K 2102/103* (2023.02)

(56) References Cited

U.S. PATENT DOCUMENTS

| | | |
|---|---|---|
| 2004/0090187 A1 | 5/2004 | Wu et al. |
| 2007/0170855 A1 | 7/2007 | Choi et al. |
| 2013/0220680 A1 | 8/2013 | Tazawa et al. |
| 2017/0047481 A1 | 2/2017 | Bonar et al. |
| 2018/0366565 A1 | 12/2018 | Chen et al. |
| 2019/0229172 A1 | 7/2019 | Liu et al. |

FOREIGN PATENT DOCUMENTS

| | | |
|---|---|---|
| CN | 103155725 A | 6/2013 |
| CN | 107170762 A | 9/2017 |
| CN | 107680993 A | 2/2018 |
| CN | 107910351 A | 4/2018 |
| CN | 108321207 A | 7/2018 |
| CN | 109037288 A | 12/2018 |
| CN | 109994530 A | 7/2019 |
| GB | 2329280 A | 11/1998 |
| JP | 1999087052 A | 3/1999 |
| JP | 2016184474 A | 10/2016 |

DISPLAY DEVICES, DISPLAY PANELS, AND METHODS FOR MANUFACTURING THE SAME

CROSS-REFERENCE TO RELATED APPLICATIONS

This application is a continuation under 35 U.S.C. § 120 of international patent application PCT/CN2019/106388 filed on Sep. 18, 2019, which claims priority to Chinese Patent Application No. 201910244450.8, filed on Mar. 28, 2019 in the China National Intellectual Property Administration, and the contents of both applications are hereby incorporated by reference.

TECHNICAL FIELD

The present disclosure belongs to the field of display technology.

BACKGROUND

At present, in the field of passive matrix organic light-emitting diode (PMOLED), an electrode (for example, a cathode and/or an anode) is generally a conductive pattern protruded from a surface of a substrate.

SUMMARY

The present disclosure aims to provide a display panel, a method for manufacturing the display panel, and a display device including the display panel.

In an embodiment, the display panel includes two electrode layers and a luminous functional layer stacked between the two electrode layers. Each of the two electrode layers has a first surface and a second surface opposite to each other in a thickness direction of the electrode layer. The first surface of each of the two electrode layers is in contact with the luminous functional layer. Each of the two electrode layers includes at least one insulation section and at least one electrode section which are integrated as a single body. A material of the electrode section is a conductive modified form of a material of the insulation section. The electrode section is in contact with the luminous functional layer and is in a conductor state at least at the first surface.

In an embodiment, the display device includes the above-described display panel.

In an embodiment, the display device further includes a photographing component disposed at a back side of the display panel and configured to collect lights passed through the display panel to acquire an image of a photographed object located at a light emitting side of the display panel.

In an embodiment, the method for manufacturing the display panel includes manufacturing two electrode layers and a luminous functional layer to stack the functional layer between the two electrode layers and contact the luminous functional layer with each of the two electrode layers. Each of the two electrode layers is manufactured by: preparing an oxide semiconductor layer; forming a light shield on a first surface of the oxide semiconductor layer, wherein a first section of the oxide semiconductor layer is covered by the light shield and a second section of the oxide semiconductor layer is exposed from the light shield; modifying the second section of the oxide semiconductor layer to be electrical conductive from the first surface of the oxide semiconductor layer; and removing the light shield, thereby obtaining the electrode layer.

The electrode layer itself of the display panel in the present disclosure has both the electrical conducting function and the insulating function. The electrode sections of the electrode layer can substitute the anode scanning lines and the cathode scanning lines in the conventional display panel, and no conductive pattern is required to be disposed as an additional electrode, thereby significantly reducing the optical disturbance, such as the interference and the diffraction of lights, caused by the conductive pattern and increasing the resolution of the photographing component.

DETAILED DESCRIPTION

For the PMOLED structure provided with a photographing component hidden under a transparent display panel, the patterned region may produce optical disturbance (such as interference and diffraction) on lights passing through the display panel, rendering images captured by the photographing component unclear.

For a clear understanding of the technical features, objects and effects of the present disclosure, specific embodiments of the present disclosure will now be described in detail with reference to the accompanying drawings. It is to be understood that the following description is merely exemplary embodiments of the present disclosure, and is not intended to limit the scope of the present disclosure.

As described above, when a photographing component is disposed and hidden under a conventional transparent PMOLED display panel, the electrode pattern region of the display panel may produce optical disturbance on lights passing therethrough, for example, diffraction grating may be resulted from the anode pattern and/or the cathode pattern of the display panel, rendering images captured by the photographing component unclear.

In view of this, the present disclosure provides an electrode layer, a display device including the electrode layer, and a display panel. The electrode layer adopts a partially conductive integrated layer structure to avoid the optical disturbance caused by the electrode pattern and increase the resolution of the images captured by the photographing component.

The present disclosure will be described in detail below with reference to the specific embodiments shown in FIGS. 1 to 8.

Figure 1:
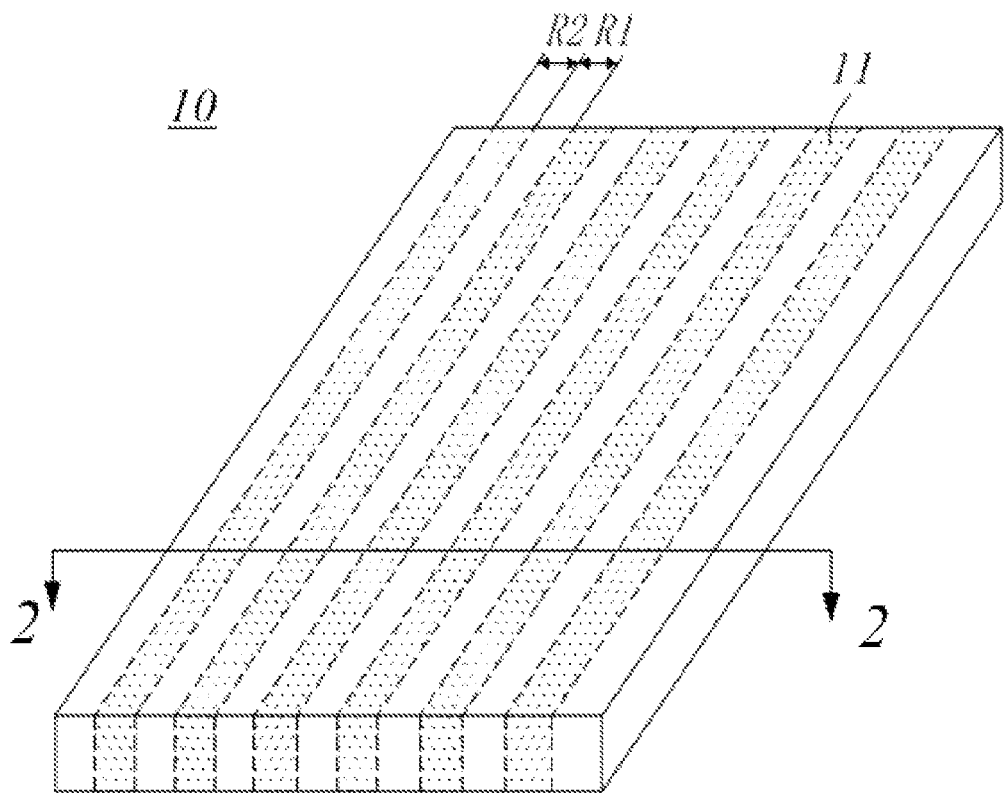
FIG. 1 is a schematic perspective view of an electrode layer according to an embodiment of the present disclosure.
Figure 2:
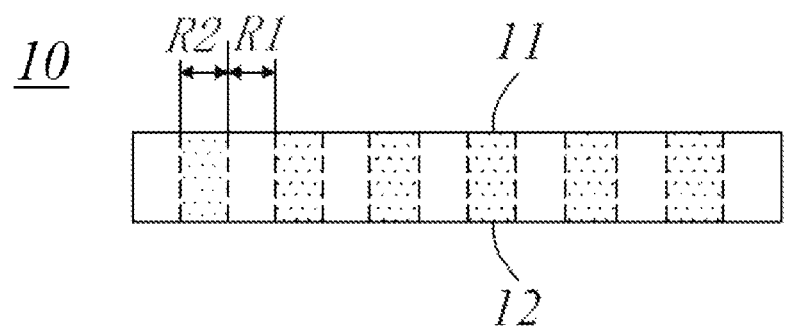
FIG. 2 is a schematic sectional view of the electrode layer, taken along line 2-2 shown in FIG. 1, in a thickness direction of the electrode layer according to an embodiment of the present disclosure.
Figure 3:
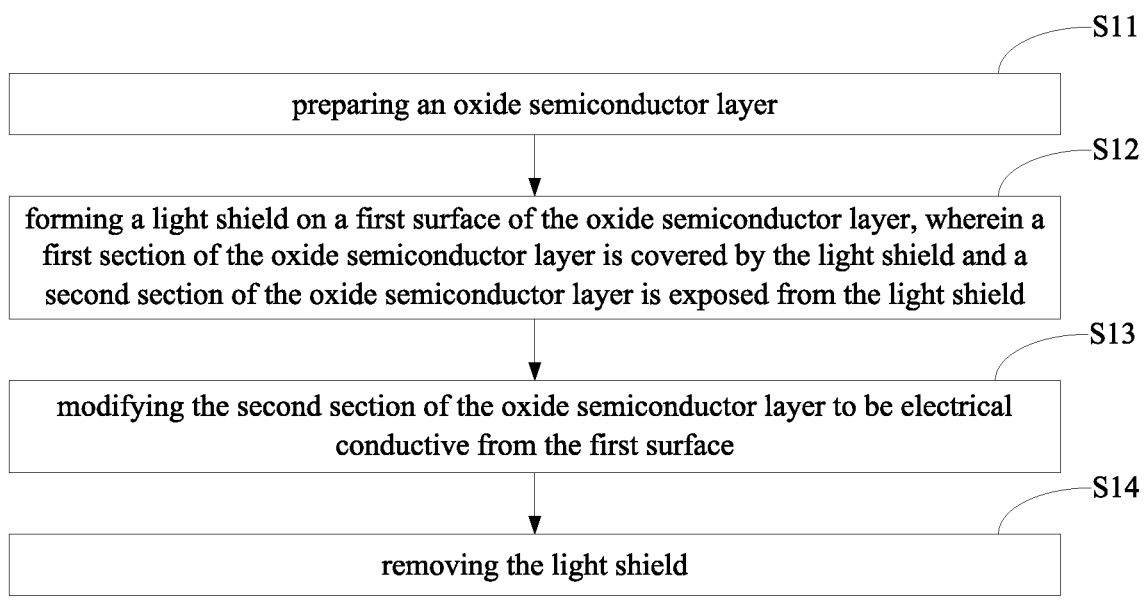
FIG. 3 is a flow chart of a manufacturing process of the electrode layer according to an embodiment of the present disclosure.
Figure 4A:
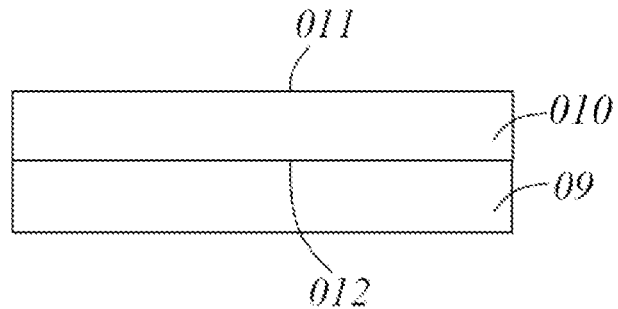
FIG. 4A is a schematic view of preparing an oxide semiconductor layer in the manufacturing process of the electrode layer according to an embodiment of the present disclosure.
Figure 4B:
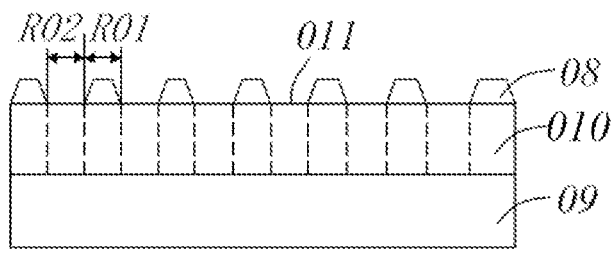
FIG. 4B is a schematic view of forming a light shield in the manufacturing process of the electrode layer according to an embodiment of the present disclosure.
Figure 4C:
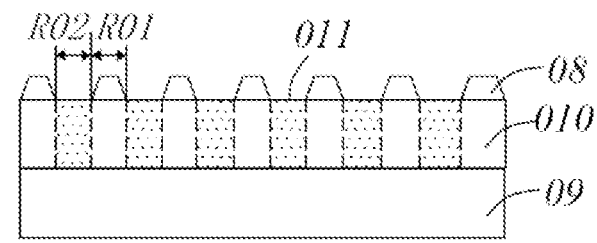
FIG. 4C is a schematic view of electrical conductive modification in the manufacturing process of the electrode layer according to an embodiment of the present disclosure.
Figure 4D:
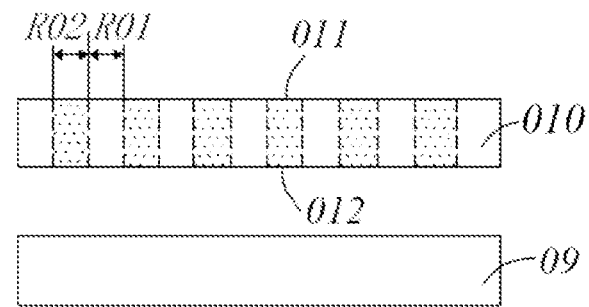
FIG. 4D is a schematic view of removing the light shield in the manufacturing process of the electrode layer according to an embodiment of the present disclosure.

Referring to FIGS. 1 and 2, an embodiment of an electrode layer 10 is shown. The electrode layer 10 is a continuous and integrated layer structure with a uniform thickness. The electrode layer 10 has a first surface 11 and a second surface 12. The first surface 11 and the second surface 12 are two flat surfaces of the electrode layer 10, having relatively large areas. The first surface 11 and the second surface 12 are opposite to each other in a thickness direction of the electrode layer 10.

The electrode layer 10 includes at least one insulation section R1 and at least one electrode section R2.

The insulation section R1 and the electrode section R2 are arranged side by side in an extension direction of the electrode layer 10, i.e., in a direction perpendicular to the thickness direction of the electrode layer 10, and are integrated as a single body. There is no obvious interface between the insulation section R1 and the electrode section R2, and no other layer is interposed between the insulation section R1 and the electrode section R2. The dashed lines and the dot matrixes shown in the drawings are merely used to differentiate the insulation sections R1 and the electrode sections R2, but are not to be constructed as limiting the technical solutions of the present disclosure.

A material of the insulation section R1 is an oxide semiconductor. The insulation section R1 is continuously in a semiconducting state from the first surface 11 to the second surface 12. A material of the electrode section R2 is a conductive modified form of the oxide semiconductor. The oxide semiconductor can be, for example, indium gallium zinc oxide (IGZO). It is found that a resistivity difference between the electrode section R2 and the insulation section R1 can be equal to or larger than $1 \times 10^5$ Ω·m. Therefore, the electrode layer 10 itself has both the conducting function and the insulating function, and it is not required to obtain an electrode by disposing an additional conductive pattern on an insulation layer. In practice, the electrode section R2 can act as an electrode part of the electrode layer 10, while the insulation section R1 can act as an insulation part of the electrode layer 10. The electrode layer 10 can significantly reduce the optical disturbance, such as the interference and the diffraction, caused by the conductive pattern additionally disposed on the insulation layer.

The electrode section R2 is in conductive state at least at the first surface 11. The electrode section R2 can be made by electrical conductive modification of the oxide semiconductor, i.e., by modifying the oxide semiconductor to be electrical conductive. Depending on the degree or the implementation manner of the electrical conductive modification, the conductive modified structure, i.e., the electrode section R2, can be in a state gradually changing from conductor to semiconductor along the direction from the first surface 11 to the second surface 12, or gradually changing from conductor to semiconductor and then changing back to conductor along the direction from the first surface 11 to the second surface 12, or can be continuously in the conductive state along the direction from the first surface 11 to the second surface 12.

In an embodiment, numbers of the insulation sections R1 and the electrode sections R2 are both plural. The plurality of insulation sections R1 and the plurality of electrode sections R2 are arranged in shapes of strips in the extension direction of the electrode layer 10. One electrode section R2 is disposed between any two adjacent insulation sections R1. One insulation section R1 is disposed between any two electrode sections R2.

Since the electrode layer 10 itself in the present disclosure has both the conducting function and the insulation function, the conventional conductive pattern is not required to be disposed. In practice, the electrode section R2 can act as the electrode part of the electrode layer 10, while the insulation section R1 can act as the insulation part of the electrode layer 10. Thus, the structure and the manufacturing method of the electrode layer 10 are significantly different from those of the conventional conductive pattern. The electrode layer 10 can be used as an anode layer or a cathode layer in the display panel to significantly reduce the optical disturbance, such as the interference and the diffraction, caused by the conductive pattern to ensure the high resolution of the image captured by the photographing component.

Referring to FIG. 3 and FIGS. 4A-4D, an embodiment of a manufacture process of the electrode layer 10 is shown. The manufacture process includes steps as follows.

S11, preparing an oxide semiconductor layer 010.

S12, forming a light shield 08 on a first surface 011 of the oxide semiconductor layer 010, wherein a first section R01 of the oxide semiconductor layer 010 is covered by the light shield 08, and a second section R02 of the oxide semiconductor layer 010 is exposed from the light shield 08.

S13, modifying the second section R02 of the oxide semiconductor layer 010 to be electrical conductive from the first surface 011, to form the second section R02 of the oxide semiconductor layer 010 into the electrode section R2 of the electrode layer 10.

S14, removing the light shield 08.

In the step S11, the oxide semiconductor layer 010 has the first surface 011 and a second surface 012. The first surface 011 and the second surface 012 are two flat surfaces, of the oxide semiconductor layer 010, having relatively large areas. The first surface 011 and the second surface 012 are opposite to each other in a thickness direction of the oxide semiconductor layer 010.

In an embodiment, a preparing process of the oxide semiconductor layer 010 can include: providing a substrate 09; and forming the oxide semiconductor layer 010 at a side of the substrate 09 by a method such as the physical vapor deposition or the chemical vapor deposition. The substrate 09 can be a transparent substrate such as a glass transparent substrate and a plastic transparent substrate. In this embodiment, the second surface 012 of the oxide semiconductor layer 010 is attached to the substrate 09. The first surface 011 of the oxide semiconductor layer 010 is away from the substrate 09 and exposed to an operable space. In an alternative embodiment, the oxide semiconductor layer 010 can be directly prepared without using the substrate 09. The oxide semiconductor layer 010 can be transparent. A material of the oxide semiconductor layer 010 can be one or more of zinc oxide (ZnO), tin oxide ($SnO_2$), indium gallium zinc oxide (IGZO), and the like, and in an embodiment, is indium gallium zinc oxide (IGZO).

In the step S12, the first section R01 and the second section R02 are arranged side by side in an extension direction of the oxide semiconductor layer 010, i.e., in a direction perpendicular to the thickness direction of the oxide semiconductor layer 010. There is no obvious interface between the first section R01 and the second section R02, and no other layer is interposed between the first section R01 and the second section R02. The dashed lines and the dot matrixes shown in the drawings are merely used to differentiate the first sections R01 and the second sections R02, and are not to be constructed as limiting the technical solutions of the present disclosure.

Stated another way, the section of the oxide semiconductor layer 010 covered by the light shield 08 is defined as the first section R01 of the oxide semiconductor layer 010, and the section of the oxide semiconductor layer 010 uncovered by the light shield 08 is defined as the second section R02 of the oxide semiconductor layer 010.

In an embodiment, a forming process of the light shield 08 can include: coating a photoresistive layer on the first surface 011, so that the entire of the first surface 011 is covered by the photoresistive layer; and subjecting a section of the photoresistive layer to exposure and development to pattern the photoresistive layer, thereby obtaining the light shield 08. More specifically, the photoresistive layer is partially removed by the regional exposure and development to expose the second section R02 of the oxide semiconductor layer 010, while the remaining photoresistive layer forms the light shield 08. The light shield 08 is corresponding to the first section R01 of the oxide semiconductor layer 010, that is, the projected area of the light shield 08 on the oxide semiconductor layer 010 is corresponding to the first section R01 of the oxide semiconductor layer 010.

The first section R01 of the oxide semiconductor layer 010 is intended to form the insulation section R1 of the electrode layer 10, while the second section R02 of the oxide semiconductor layer 010 is intended to form the electrode section R2 of the electrode layer 10.

In an embodiment, numbers of the first sections R01 and the second sections R02 are both plural. The plurality of first sections R01 and the plurality of second sections R02 are arranged in shapes of strips in the extension direction of the oxide semiconductor layer 010. One second section R02 is disposed between any two adjacent first sections R01. One first section R01 is disposed between any two second sections R02. Correspondingly, the light shield 08 includes a plurality of shield sections arranged in shapes of strips in the extension direction of the oxide semiconductor layer 010. The plurality of shield sections are corresponding to the plurality of first sections R01 in an one-to-one manner.

In the S13, the second section R02 exposed to the operable space can be modified to be electrical conductive from the first surface 011 attached with the light shield 08. More specifically, the second section R02 can be bombarded with a plasma from the first surface 011 to modify the second section R02 to be electrical conductive gradually from the first surface 011 to the second surface 012. In an alternative embodiment, each of the first surface 011 and the second surface 012 is provided with the light shield 08 covering the first section R01, and the second section R02 is modified to be conductive from both the first surface 011 and the second surface 012.

The plasma can be any plasma capable of generating $H^+$, such as hydrogen plasma, or can be other plasma, such as helium or argon plasma.

In practice, after the modification, depending on the degree or the implementation manner of the modification, the second section R02 of the oxide semiconductor layer 010 can be in a state gradually changing from conductor to semiconductor along the direction from the first surface 011 to the second surface 012, or gradually changing from conductor to semiconductor and then changing back to conductor along the direction from the first surface 011 to the second surface 012, or can be continuously conductive along the direction from the first surface 011 to the second surface 012.

In the step S14, the light shield 08 covering the first section R01 of the oxide semiconductor layer 010 can be removed by mechanical exfoliation or ashing.

After removing the light shield 08, the oxide semiconductor layer 010 becomes the electrode layer 10, the first section R01 of the oxide semiconductor layer 010 becomes the insulation section R1 of the electrode layer 10, and the second section R2 of the oxide semiconductor layer 010 becomes the electrode section R2 of the electrode layer 10. Correspondingly, the first surface 011 of the oxide semiconductor layer 010 becomes the first surface 11 of the electrode layer 10, and the second surface 012 of the oxide semiconductor layer 010 becomes the second surface 12 of the electrode layer 10.

In the manufacturing method of the electrode layer 10 in the present disclosure, due to the partial electrical conductive modification of the oxide semiconductor layer 010, the resistivity difference between the conductive modified section (i.e. the electrode section R2) and the unmodified section (i.e. the insulation section R1) can be equal to or larger than $1 \times 10^5$ Ω·m. Therefore, the electrode layer 10 itself has both the electrical conducting function and the electrical insulating function. When the electrode layer 10 is used as an anode layer or a cathode layer in the display panel, the optical disturbance, such as the interference and the diffraction, caused by the conductive pattern can be significantly reduced to ensure the high resolution of the image captured by the photographing component.

Figure 5:
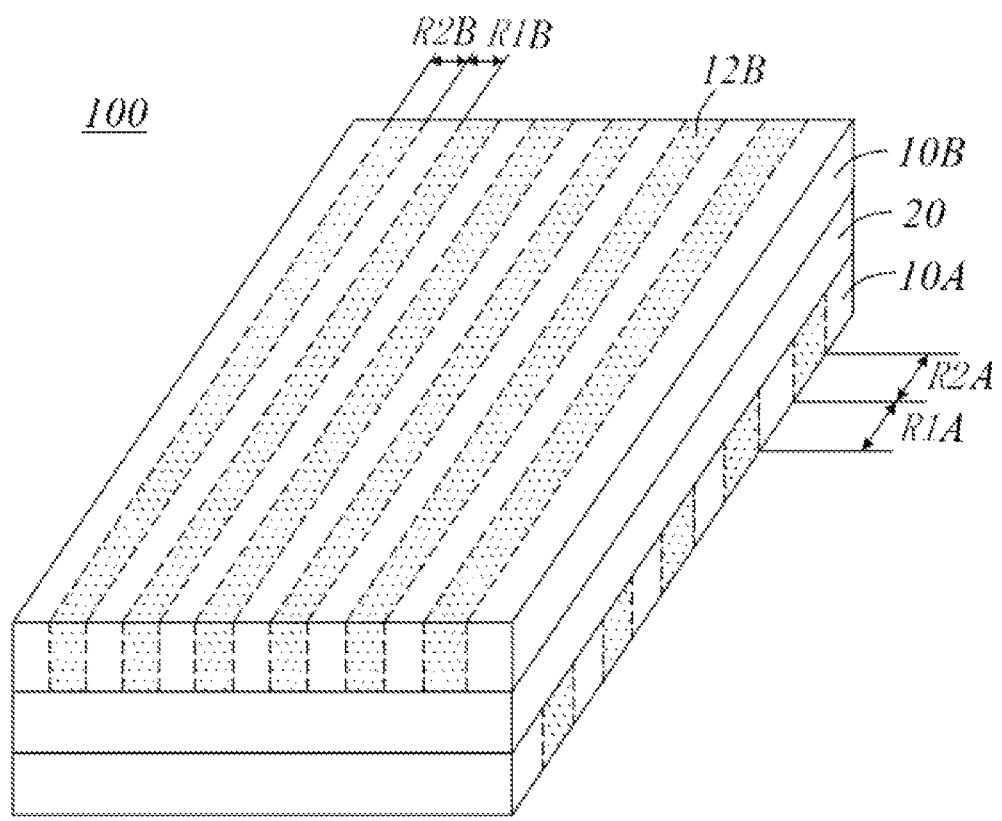
FIG. 5 is a schematic perspective view of a display panel according to an embodiment of the present disclosure.
Figure 6:
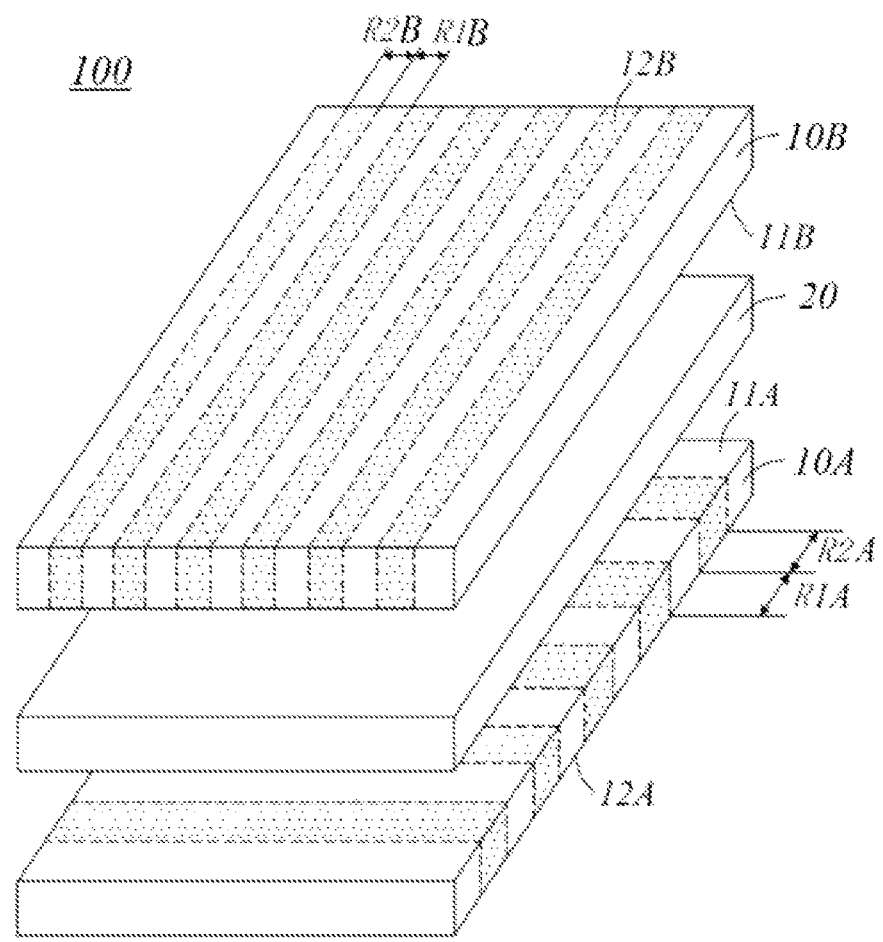
FIG. 6 is a schematic exploded view of the display panel according to an embodiment of the present disclosure.

Referring to FIGS. 5 and 6, an embodiment of a display panel 100 is shown. In the following description, a passive matrix-driven organic light-emitting display panel is used as an example of the display panel. However, it should be understood that the display panel 100 is not limited to this type of display panel.

The display panel 100 includes an anode layer 10A, a luminous functional layer 20, and a cathode layer 10B sequentially stacked in a thickness direction of the display panel 10. The luminous functional layer 20 is respectively in contact with the cathode layer 10B and the anode layer 10A.

Figure 8:
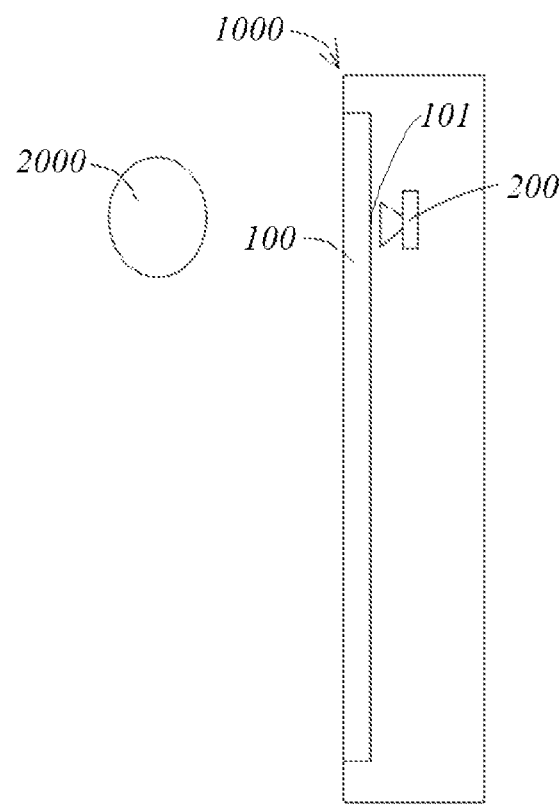
FIG. 8 is a schematic structural view of a display device according to an embodiment of the present disclosure.

Referring to FIG. 8, the display panel 100 has a transparent region 101. The transparent region 101 is configured to pass lights from a light emitting side of the display panel 100 to a back side of the display panel 100. A section of the luminous functional layer 20 in the transparent region 101 is a transparent section, and a section of the luminous functional layer 20 not in the transparent region 101 can be a nontransparent section. Stated another way, the luminous functional layer 20 includes a section in the transparent region 101 and another section not in the transparent region 101. In an alternative embodiment, the entire of the luminous functional layer 20 can be a transparent layer.

The luminous functional layer 20 can include a plurality of light-emitting pixels arranged in parallel. The plurality of light-emitting pixels can include a red light-emitting pixel, a blue light-emitting pixel, and a green light-emitting pixel. Each light-emitting pixel is respectively in contact with the cathode layer 10B and the anode layer 10A to receive holes from the anode layer 10A and electrons from the cathode layer 10B.

Each light-emitting pixel can include an electron transport layer, a hole transport layer, and a light-emitting layer located between the electron transport layer and the hole transport layer. When a bias voltage is applied to the display panel 100, electrons are injected from the cathode layer 10B, and holes are injected from the anode layer 10A. The electrons and holes are respectively transmitted in the electron transport layer and the hole transport layer in the form of collision waves, and finally recombined in the light-emitting layer, so as to excite molecules in the light-emitting layer to generate singlet excitons. The singlet excitons emit lights due to radiation attenuation.

In this embodiment, the anode layer 10A and the cathode layer 10B are respectively implemented in the same manner as the electrode layer 10. Stated another way, the display panel 10 includes two electrode layers 10, one acts as the anode layer 10A, and the other one acts as the cathode layer 10B.

The anode layer 10A can have a first anode surface 11A in contact with the luminous functional layer 20 and a second anode surface 12A away from the luminous functional layer 20. The first anode surface 11A is corresponding to the first surface 11 of the electrode layer 10. The second anode surface 12A is corresponding to the second surface 12 of the electrode layer 10. The anode layer 10A can include a plurality of insulation sections R1A and a plurality of electrode sections R2A. The insulation section R1A and the electrode section R2A are substantially the same as the insulation section R1 and the electrode section R2 as described above and will not be repeated herein. For clarity, the electrode section R2A of the anode layer 10A is referred as the anode section R2A hereafter.

Similarly, the cathode layer 10B can have a first cathode surface 11B in contact with the luminous functional layer 20 and a second cathode surface 12B away from the luminous functional layer 20. The first cathode surface 11B is corresponding to the first surface 11 of the electrode layer 10. The second cathode surface 12B is corresponding to the second surface 12 of the electrode layer 10. The cathode layer 10B can include a plurality of insulation sections R1B and a plurality of electrode sections R2B. The insulation section R1B and the electrode section R2B are substantially the same as the insulation section R1 and the electrode section R2 as described above and will not be repeated herein. For clarity, the electrode section R2B of the cathode layer 10B is referred as the cathode section R2B hereafter.

As described above, the electrode section R2 of the electrode layer 10 is in the conductive state at least at the first surface 11. Correspondingly, the anode section R2A of the anode layer 10A is in the conductive state at least at the first anode surface 11A, so that the anode section R2 can supply holes to the luminous functional layer 20 from the first anode surface 11A. Similarly, the cathode section R2B of the cathode layer 10B is in the conductive state at least at the first cathode surface 11B, so that the cathode section R2B can supply electrons to the luminous functional layer 20 from the first cathode surface 11B.

Furthermore, in this embodiment, the plurality of anode sections R2A of the anode layer 10A are arranged in shapes of strips in a first direction. Each of the anode sections R2A works the same as the conventional anode. The plurality of cathode sections R2B of the cathode layer 10B are arranged in shapes of strips in a second direction. Each of the cathode sections R2B works the same as the conventional cathode. The first direction and the second direction are both perpendicular to a thickness direction of the display panel and are transverse to each other, for example, orthogonal to each other.

Figure 7:
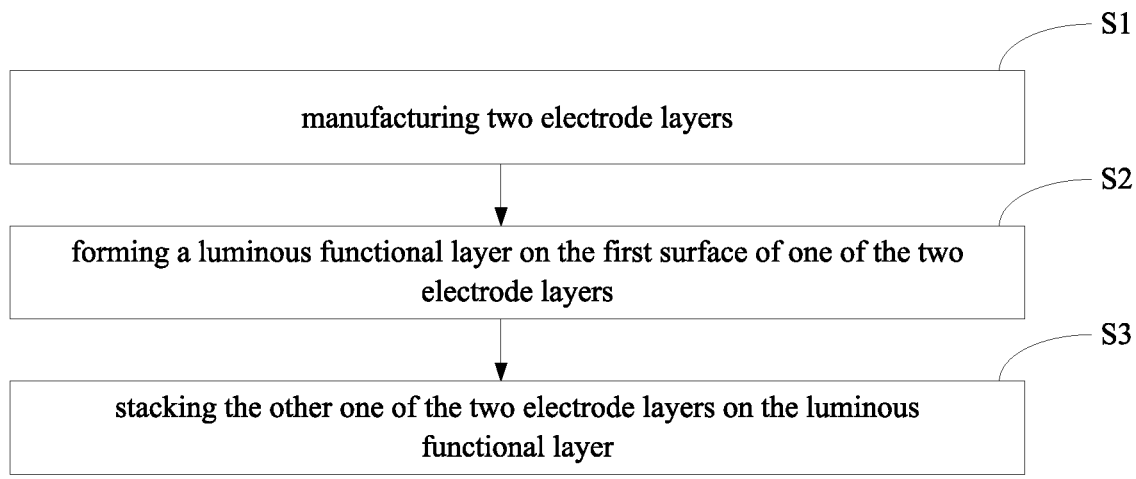
FIG. 7 is a flow chart of a method for manufacturing the display panel according to an embodiment of the present disclosure.

Referring to FIG. 7, an embodiment of a method for manufacturing the display panel 100 is shown. The method includes steps as follow.

S1, manufacturing two electrode layers 10.

S2, forming the luminous functional layer 20 on the first surface 11 of one of the two electrode layers 10.

S3, stacking the other one of the two electrode layers 10 on the luminous functional layer 20.

In the step S1, the two electrode layers 10 can be manufactured according to the manufacture process of the electrode layer 10 as described above, and the manufacture processes of the two electrode layers 10 will not be repeated herein.

In the step S2, in an embodiment, the luminous functional layer 20 can be formed by an evaporation method. More specifically, the hole transport layer, the light-emitting layer, and the electron transport layer of the luminous functional layer 20 can be sequentially deposited onto the first surface 11 of the one of the two electrode layers 10. In this embodiment, the one of the two electrode layers 10 is the anode layer 10A of the display panel 100, and the first surface 11 of the one of the two electrode layers 10A is the first anode surface 11A of the anode layer 10A.

In the step S3, the first surface 11 of the other one of the two electrode layers 10 is also in contact with the luminous functional layer 20, so that the luminous functional layer 20 is located between the two electrode layers 10 and respectively in contact with the two electrode layers 10. The one of the two electrode layers 10, the hole transport layer, the light-emitting layer, the electron transport layer, and the other one of the two electrode layers 10 are sequentially stacked in the thickness direction.

In this embodiment, the other one of the two electrode layers 10 is the cathode layer 10B of the display panel 100, and the first surface 11 of the other one of the two electrode layers 10 is the first cathode surface 11B of the cathode layer 10B.

In an alternative embodiment, the one of the two electrode layers 10 in the S2 can be the cathode layer 10B of the display panel 100, and the other one of the two electrode layers 10 in the S3 can be the anode layer 10A of the display panel 100. Correspondingly, in the step S2, the electron transport layer, the light-emitting layer, and the hole transport layer of the luminous functional layer 20 can be sequentially deposited onto the first surface 11 of the one of the two electrode layers 10.

It should be understood that in the present disclosure, the reference numbers of steps such as S1, S2, and S3 are only used herein to distinguish a step from another step, and do not require or imply any actual sequence between these steps. Moreover, the order of description of the sub-steps should not be construed to imply that these sub-steps are order dependent. For example, in the manufacturing of the two electrode layers 10, the two electrode layers 10 can be manufactured at the same time or in sequence. For example, both the two electrode layers 10 can be manufactured before the formation of the luminous functional layer 20; or one of the two electrode layers 10 can be manufactured before the formation of the luminous functional layer 20, and the other one of the two electrode layers 10 can be manufactured after or during the formation of the luminous functional layer 20, and the like. In an embodiment, the substrate 09 can be the substrate of the display panel 100. One of the two electrode layers 10 can be directly manufactured on the substrate 09.

The luminous functional layer 20 can be formed on the one of the two electrode layers 10, and the other one of the two electrode layers 10 can be formed on the luminous functional layer 20. The display panel 100 in this embodiment adopts two electrode layers 10 as its anode layer 10A and cathode layer 10B. The electrode layer 10 itself has both the conducting function and the insulation function, therefore, the electrode layer 10 can substitute the anode scanning lines or cathode scanning lines in the conventional PMOLED display panel. A voltage can be applied to the display panel 100 directly through the two electrode layers 10 without using the conductive pattern, thereby significantly reducing the optical disturbance such the interference or the diffraction caused by the conventional conductive pattern.

Referring to FIG. 8, an embodiment of a display device 1000 is shown. The display device 1000 includes a display panel 100 and a photographing component 200.

As described above, the display panel 100 has a light emitting side facing toward the user and a back side facing away from the user. The photographing component 200 can be disposed at the back side of the display panel 100, more specifically, within an orthographic projection (i.e. the projection in the thickness direction) of the transparent region 101 of the display panel 100, to collect lights passed through the display panel 100 to acquire an image of the photographed object 2000 located at the light emitting side of the display panel.

In this embodiment, as described above, the anode layer 10A and the cathode layer 10B of the display panel 100 are respectively implemented in the same manner as the electrode layer 10. A voltage can be applied to the display panel 100 directly through the two electrode layers without the conductive pattern, thereby significantly reducing the optical disturbance such the interference or the diffraction caused by the conductive pattern and ensuring the high resolution of the image captured by the photographing component 200.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present disclosure.

What described above are only several implementations of the present disclosure, and these embodiments are specific and detailed, but not intended to limit the scope of the present disclosure. It should be understood by the skilled in the art that various modifications and improvements can be made without departing from the conception of the present disclosure, and all fall within the protection scope of the present disclosure. Therefore, the patent protection scope of the present disclosure is defined by the appended claims.

What is claimed is:

1. A display panel comprising:
two electrode layers, each of the two electrode layers having a first surface and a second surface opposite to each other in a thickness direction of each of the two electrode layers, each of the two electrode layers comprising at least one insulation section and at least one electrode section, the at least one insulation section and the at least one electrode section being integrated as a single body, and a material of the electrode section being a conductive modified form of a material of the insulation section; and
a luminous functional layer, formed between the two electrode layers, the first surface of each of the two electrode layers being in contact with the luminous functional layer;
wherein the electrode section is in contact with the luminous functional layer and is in a conductive state at least at the first surface.

2. The display panel of claim 1, wherein each of the two electrode layer is a continuous and integrated layer structure with a uniform thickness.

3. The display panel of claim 1, wherein the at least one insulation section and the at least one electrode section comprise a plurality of insulation sections and a plurality of electrode sections arranged alternatively in a direction perpendicular to the thickness direction.

4. The display panel of claim 3, wherein the insulation section and the electrode section are in shapes of stripes.

5. The display panel of claim 4, wherein the insulation section and the electrode section of one of the two electrode layers extend in a first direction, the insulation section and the electrode section of the other one of the two electrode layers extend in a second direction, and the first direction is transverse to the second direction.

6. The display panel of claim 1, wherein the material of the insulation section is an oxide semiconductor, and the material of the electrode section is a conductive modified form of the oxide semiconductor.

7. The display panel of claim 6, wherein the oxide semiconductor is selected from the group consisting of zinc oxide, tin oxide, indium gallium zinc oxide, and any combination thereof.

8. The display panel of claim 1, wherein a resistivity difference between the electrode section and the insulation section of each of the two electrode layers is equal to or larger than $1 \times 10^5$ Ω·m.

9. The display panel of claim 1, wherein the electrode section of each of the two electrode layers is continuously in the conductive state along a direction from the first surface to the second surface.

10. The display panel of claim 1, wherein the electrode section of each of the two electrode layers is in a state gradually changing from conductor to semiconductor along a direction from the first surface to the second surface.

11. The display panel of claim 1, wherein the electrode section of each of the two electrode layers is in a state gradually changing from conductor to semiconductor and then changing back to conductor along a direction from the first surface to the second surface.

12. The display panel of claim 1, further having a transparent region configured to pass lights from a light emitting side to a back side of the display panel, wherein the luminous functional layer is transparent in the transparent region.

13. The display panel of claim 1, wherein the luminous functional layer comprises a plurality of light-emitting pixels arranged in parallel, and each of the plurality of light-emitting pixels is in contact with the electrode section of each of the two electrode layers to receive holes from the electrode section of one of the two electrode layers and electrons from the electrode section of the other one of the two electrode layers.

14. The display panel of claim 1, wherein the display panel is a passive matrix-driven organic light-emitting display panel.

15. A display device, comprising the display panel according to claim 1.

16. The display device of claim 15, further comprising a photographing component disposed at a back side of the display panel and configured to collect lights passed through the display panel to acquire an image of an object located at a light emitting side of the display panel.

\* \* \* \* \*